United States Patent [19] [11] 3,731,230
Cerny, Jr. [45] May 1, 1973

[54] BROADBAND CIRCUIT FOR MINIMIZING THE EFFECTS OF CRYSTAL SHUNT CAPACITANCE

[75] Inventor: Frank J. Cerny, Jr., North Riverside, Ill.

[73] Assignee: Motorola, Inc., Franklin Park, Ill.

[22] Filed: Dec. 17, 1971

[21] Appl. No.: 209,230

[52] U.S. Cl. ................331/116 R, 331/105, 331/158
[51] Int. Cl. ................................................H03b 5/36
[58] Field of Search.......................331/116, 105, 158

[56] References Cited

UNITED STATES PATENTS 2,021,722 11/1935 Goldstine et al.....................331/158
2,060,592 11/1936 Roberts...............................331/158
2,454,132 11/1948 Brown.................................331/105

*Primary Examiner*—John Kominski
*Attorney*—Vincent J. Rauner et al.

[57] ABSTRACT

A crystal controlled oscillator circuit having broadband circuitry for balancing out the effects of the static shunt capacitance of a crystal. A broadband phase inverting network is connected across the crystal to cancel the signal flowing through the crystal as a result of capacitive coupling between the plates. The phase inverting network may include a transformer, a center tapped inductor or a broadband inductance-capacitance network. A capacitor having a capacitance value related to the value of the static shunt capacitance is used in conjunction with the phase inverting network to determine the magnitude of the phase inverted cancellation signal.

2 Claims, 3 Drawing Figures

BROADBAND CIRCUIT FOR MINIMIZING THE EFFECTS OF CRYSTAL SHUNT CAPACITANCE

BACKGROUND

This invention relates generally to crystal controlled oscillators, and more particularly to minimizing the effects of the static shunt capacitance of an oscillator crystal over a wide range of frequencies.

Several techniques for reducing the effects of the static shunt capacitance of a crystal on the operation of an oscillator are known. These systems generally employ an inductor or an inductance-capacitance network connected in parallel with the oscillator crystal to form a parallel resonant circuit with the static shunt capacity of the crystal. The values of the components in the aforementioned circuit are chosen so that the circuit is parallel resonant with the crystal shunt capacity at the operating frequency of the oscillator, thereby effectively tuning out the crystal shunt capacitance for a narrow range of frequencies near the operating frequency of the oscillator.

Whereas these techniques provide useful ways to tune out the effects of crystal shunt capacity over a limited range of frequencies, there is a need, particularly in frequency modulated and overtone oscillators, for a system that minimizes the affect of the crystal shunt capacitance over a wide range of frequencies. It is particularly desirable to provide broadband balancing out of the crystal shunt capacitance in a frequency modulated oscillator because the maximum amount of modulation is limited by the degree of accuracy with which the static shunt capacitance is balanced out. Furthermore, it is desirable to balance out the crystal shunt capacity over a broad range of frequencies in an overtone oscillator to prevent oscillation at undesired frequencies determined by the crystal shunt capacity and other oscillator circuit components.

SUMMARY

Accordingly, it is an object of the present invention to provide a circuit that balances out the static shunt capacitance of a crystal over a broad range of operating frequencies.

It is another object of this invention to provide a crystal shunt capacitance balancing circuit that does not require tuning.

It is a further object of this invention to provide a crystal controlled oscillator that can be frequency modulated over a wide range of frequencies.

It is yet another object of this invention to provide an overtone crystal oscillator that oscillates reliably at the desired overtone, and is substantially free from spurious oscillation modes.

In accordance with a preferred embodiment of the invention, a broadband phase inverting network, such as, for example, a broadband transformer is connected to the crystal. The phase inverting circuit is connected in series with a capacitor having a capacitance related to the static shunt capacitance of the crystal. The series capacitor provides a signal which is related to the signal flowing in the static shunt capacitance of the crystal. This signal is applied to the phase inverting circuit for application to the crystal in phase opposition to the signal flowing in the static shunt capacity, thereby substantially cancelling the signal passed by the static shunt capacity. Cancellation is obtained over a wide range of frequencies and does not depend on precise tuning of a parallel resonant circuit as in the prior art.

The instant balancing system is applicable to circuits employing quartz crystals or similar resonators including fundamental and overtone oscillators and frequency modulated oscillators. The system may be provided by other structural embodiments, as including a center tapped inductor, or a broadband inductance-capacitance network.

DETAILED DESCRIPTION

Figure 1:
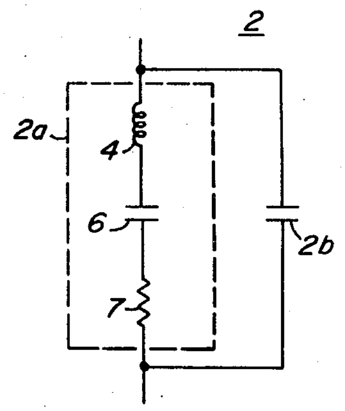
FIG. 1 is a circuit diagram of the equivalent circuit of a quartz crystal or similar piezoelectric resonator.

Referring to FIG. 1, there is shown a well known equivalent circuit diagram of a quartz crystal or similar piezoelectric resonator. FIG. 1 is used to explain the operation of a quartz crystal in order that the operation of the balancing circuit of the invention be more easily understood. The equivalent circuit of a quartz crystal 2 includes an inductor 4, a capacitor 6 and a resistor 7 connected in a series circuit. The aforementiond components are referred to as the motional inductance, the motional capacitance and the series resistance of the crystal, respectively, and are generally designated as a motional impedance 2*a*. The values of these components are determined by the motional or vibrational characteristics of the crystal and are the basic frequency determining elements of the crystal. A static shunt capacitor 2*b*, resulting from the capacitive coupling between the electrodes of the crystal, is shown connected in parallel with the series combination of inductor 4, capacitor 6 and resistor 7. The value of capacitor 2*b* is determined by the size and spacing of the electrodes making contact with the quartz crystal, by the capacitance of the wire leads connected to the electrodes and by the capacitance of the crystal case and holder in which the crystal blank is mounted. Capacitor 2*b* is referred to as the static shunt capacitance of the crystal.

The circuit of FIG. 1 has a series resonant frequency at which inductor 4 and capacitor 6 are series resonant with each other, and a parallel resonant frequency slightly higher than the series resonant frequency. At the parallel resonant frequency, capacitor 2*b* is parallel resonant with the motional impedance 2*a* including inductor 4 and capacitor 6. The impedance of crystal 2 at the series resonant frequency is determined by the values of resistor 7 and capacitor 2*b* because the inductive reactance of inductor 4 and the capacitive reactance of capacitor 6 cancel at series resonance. In an ideal crystal, the resistance of resistor 7 is relatively low, and resistor 7 acts as a low impedance shunt across capacitor 2*b* at series resonance, thereby minimizing the effect of capacitor 2*b*. However, when crystal 2 is operated in an overtone mode, the resistance of resistor 7 can approach several hundred ohms, in which case the impedance across the terminals of crystal 2 is determined largely by the capacitive reactance of capacitor 2*b* which is relatively low at overtone frequencies.

When crystal 2 is utilized as the frequency determining element of a frequency modulated oscillator, the maximum amount of frequency deviation available from the oscillator is related to the frequency difference between the series and parallel resonant frequencies of the crystal 2. This frequency difference is increased as the static shunt capacity 2*b* is decreased.

When crystal 2 is operated in its series resonant mode as the frequency determining element of the oscillator, the impedance of the crystal must be determined by the motional impedance 2*a* including inductor 4, capacitor 6 and resistor 7 for proper operation of the oscillator. When the impedance of the crystal is determined to a large extent by the value of the static shunt capacitor 2*b*, such as, for example, when the crystal 2 is operated in an overtone mode, and the frequency of the oscillator is not determined primarily by the motional impedance 2*a*, which is the desired frequency determining component, the advantages of crystal control and significantly impaired.

In order to minimize the undesirable effects caused by shunt capacitor 2*b*, inductive circuits have in the past been connected in parallel with capacitor 2*b* to form a parallel resonant circuit with capacitor 2*b*, thereby tuning out its effects. These circuits substantially cancel the effects of capacitor 2*b* for one particular frequency, namely, the parallel resonant frequency of capacitor 2*b* and the inductive circuit connected in parallel therewith. However, this method is ineffective for frequencies other than the parallel resonant frequency of capacitor 2*b* and the parallel inductive circuit. In addition, the parallel inductive circuit requires careful tuning, and can cause spurious modes of oscillation.

Figure 2:
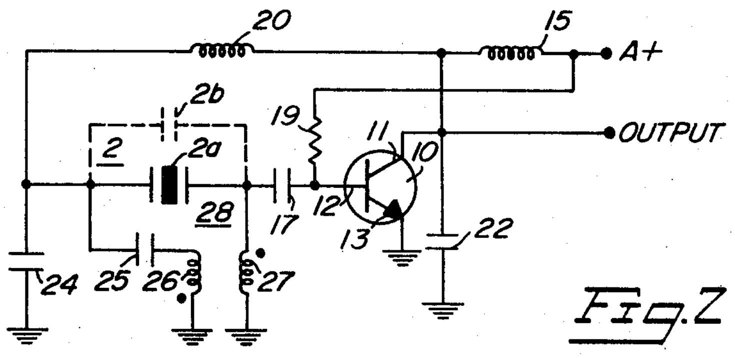
FIG. 2 is a circuit diagram of an oscillator utilizing a quartz crystal or similar element in a series resonant mode, and which employs one embodiment of the static shunt capacitance balancing circuit according to the invention.

Referring to FIG. 2, there is shown a series mode oscillator circuit utilizing one embodiment of a circuit according to the invention for balancing out the static shunt capacity of the crystal. A transistor 10 has a collector 11 connected through an inductor 15 to the power supply A+. Although an NPN transistor has been shown, it should be noted that a PNP transistor or any gain producing device may be used and still fall within the scope of the invention. A capacitor 22 is connected between collector 11 of transistor 10 and ground, and one end of an inductor 20 is also connected to collector 11. A capacitor 24 is connected between the other end of inductor 20 and ground. A crystal 2, similar to the resonator of FIG. 1 having a motional impedance 2*a* and a static shunt capacitance 2*b* (shown dotted), is connected to the junction of inductor 20 and capacitor 24 and to a base 12 of transistor 10 through a blocking capacitor 17. A resistor 19 is connected between the power supply A+ and base 12 to provide bias to transistor 10. An emitter 13 of transistor 10 is connected to ground to complete the circuit. A series circuit including a capacitor 25 and a winding 26 of a phase inverting transformer 28 is connected between the junction of inductor 20, capacitor 24, crystal 2 and ground. Transformer 28 may have any desired transfer characteristic including voltage step-up and step-down, provided that phase inversion is accomplished. A winding 27 of phase reversing transformer 28 is connected between ground and the junction of capacitor 17 and crystal 2. The output from the oscillator may be taken from collector 11, as shown, or from any convenient point on the oscillator, including inductive coupling to inductor 15.

Inductor 20 and capacitors 22 and 24 form a phase shifting network which provides a 180° phase shift between the ungrounded end of capacitor 22 and the ungrounded end of capacitor 24 at a predetermined overtone of crystal 2. Crystal 2 acts as a series pass element to complete the feedback path between collector 11 and base 12 to provide oscillations at the overtone frequency.

Capacitor 25 and phase reversing transformer 28 comprise a broadband balancing network according to the invention for minimizing the effects of the static shunt capacitance 2*b* on the operation of the oscillator.

In operation, a signal from collector 11 of transistor 10 is phase shifted 180° by the phase shifting network comprising inductor 20 and capacitors 22 and 24. The phase shifted signal is applied to crystal 2 which has a low impedance path between its terminals in each of its series resonant modes. The signal passing through crystal 2 is applied to base 12 of transistor 10 in phase with the signal present thereon, thereby providing positive feedback to sustain oscillation. The phase shifting network determines the overtone at which crystal 2 operates by providing approximately 180° phase shift to signals having frequencies of approximately the desired overtone frequency. The motional impedance 2*a* of the crystal 2 determines the exact frequency of operation. At the desired frequency of operation, the motional impedance 2*a* is relatively low, being substantially equal to the value of resistor 7 of FIG. 1. Since the motional impedance at series resonance is substantially resistive, there is substantially no phase shift through the motional impedance of crystal 2, and the conditions for oscillation are met. If the frequency of operation of the oscillator changes, the motional impedance 2*a* is no longer in resonance, and appears either inductive or capacitive. The additional impedance and phase shift introduced by the motional impedance 2*a* operating away from resonance prevents oscillation at undesired frequencies.

The static shunt capacitance 2*b* of the crystal can provide a feedback path capable of sustaining oscillation at an undesired frequency which would not be sustained by the motional impedance 2*a*. The circuitry of the present invention prevents oscillation at the undesired frequency. In this embodiment, capacitor 25 and phase reversing transformer 28 provide this function. For purposes of illustration, assume that windings 26 and 27 of transformer 28 have substantially the same number of turns. In this case, the value of capacitor 25 is chosen to be equal to the value of the static shunt capacitance 2*b*. A signal having the same magnitude as the signal passing through capacitor 2*b* then passes through capacitor 25 and is applied to transformer 28. This signal is phase shifted 180° by transformer 28 and applied to the terminal of crystal 2 connected to capacitor 17 to substantially cancel the signal passing through capacitor 2*b*, thereby substantially nullifying the effects of capacitor 2*b*. Transformer 28 is a broadband transformer, such as, for example, a bifilar wound ferrite transformer or a toroidal transformer which provides substantially 180° of phase shift, independent of frequency. Capacitor 25 determines the amount of signal applied to transformer 28, and since it has the same impedance versus frequency characteristic as capacitor 2*b*, the amount of signal applied to transformer 28 will be equal to the amount of signal passing through capacitor 2*b* at all frequencies. It should further be noted that capacitor 25 may be placed in series with either of the windings 26 or 27 of transformer 28 without substantially changing the operation of the circuit.

The number of turns in windings 26 and 27 need not be equal. However, for the case of an unequal number of turns, the value of capacitor 25 must be adjusted in accordance with the turns ratio of transformer 28. In general, the value of capacitor 25 must be approximately equal to the value of capacitor 2b multiplied by the turns ratio of transformer 28, where the turns ratio is defined as the number of turns in winding 27 divided by the number of turns in winding 26. Connecting capacitor 25 in series with winding 27 rather than in series with winding 26 requires that the value of capacitor 25 be substantially equal to the value of capacitor 2*b* divided by the turns ratio of transformer 28. Hence, it can be seen that moving capacitor 25 from one side of transformer 28 to the other, when used with a transformer having a turns ratio other than unity, requires a change in the value of capacitor 25 proportional to the square of the turns ratio of transformer 28.

Figure 3:
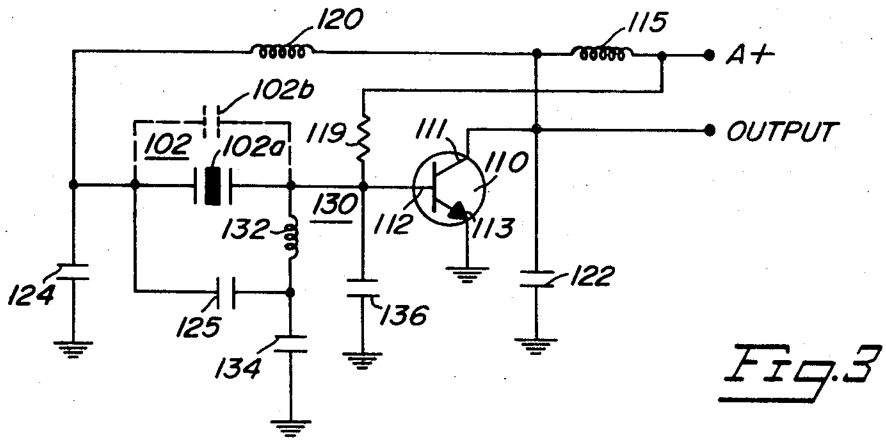
FIG. 3 is a circuit diagram of a series mode oscillator similar to the oscillator of FIG. 2 which utilizes another embodiment of a static shunt capacitance balancing circuit according to the invention.

FIG. 3 is a detailed circuit diagram of an oscillator substantially similar to the oscillator of FIG. 2 utilizing another embodiment of the balancing circuit according to the invention. The structure and operation of the oscillator of FIG. 3 is similar to that of FIG. 2, and like components in FIG. 3 having similar numeric designations to those of FIG. 2 with a 100 prefix added.

The balancing circuit of FIG. 3 includes capacitors 125, 134 and 136 and an inductor 132. Inductor 132 and capacitor 134 are connected in a series circuit between a base 112 of a transistor 110 and ground. Capacitor 136, which includes the input capacitance of transistor 110, is connected in parallel with the series combination of inductor 132 and capacitor 134 between base 112 and ground. Capacitor 125 is connected between the junction of inductor 132 and capacitor 134 and the junction of capacitor 124, inductor 120 and crystal 102. Inductor 132 and capacitors 134 and 136 form a phase inverting circuit 130 which provides a similar function to that of phase inverting transformer 28 of FIG. 2. Phase inverting circuit 130 may have any predetermined transfer function provided that the phase inverting function is retained. Inductor 132 and capacitors 134 and 136 form a capacitively tapped resonant circuit 130 which provides the desired 180° phase shift over a considerable frequency range, depending on the quality factor of the components utilized. Although the bandwidth of the phase inverting resonant circuit 130 of FIG. 3 is somewhat narrower than that of the phase inverting transformer 28 of FIG. 2, the bandwidth of the tapped resonant circuit 130 is significantly greater than the bandwidth of prior art inductive balancing circuits.

Capacitor 125 determines the amount of signal applied to the phase inverting circuit 130, and is determined by the value of the static shunt capacitance 102*b* of crystal 102 and the relative magnitudes of capacitors 134 and 136. For proper operation of the phase inverting circuit 130, the resonant frequency of this circuit, which is formed by inductor 132 and the series combination of capacitors 134 and 136, should be at or near the operating frequency of the oscillator. Capacitor 134 should be at least twice as large as capacitor 136, and the value of capacitor 125 is determined by multiplying the value of capacitor 102*b* by the ratio obtained by dividing the value of capacitor 134 by the value of capacitor 136.

The balancing circuits according to the invention provide a useful way to minimize the effects of the static shunt capacitance of a piezoelectric resonator over a broad band of frequencies. The effects of the static shunt capacity are minimized over a wider range of frequencies than has been heretofore achieved. This feature allows the construction of circuits, including oscillators and other networks utilizing piezoelectric resonators, that are substantially free from the undesirable effects of resonator static shunt capacity over a broad range of frequencies. In addition, the concepts disclosed in the present invention allow these networks to be constructed without the use of the critically tuned components previously required.

I claim:

1. An electronic crystal controlled overtone oscillator including in combination:

a transistor having input, output and common terminals;

a piezoelectric crystal having first and second electrodes with a static shunt capacitance therebetween, said piezoelectric crystal having a predetermined fundamental resonant frequency and at least one overtone frequency;

a phase inverting positive feedback circuit comprising a first capacitor connected between said output and common terminals of said transistor, an inductor having first and second terminals, said first terminal being connected to said output terminal of said transistor, and a second capacitor connected between said second terminal and said common terminal, said first and second capacitors and said inductor having values selected to provide a 180° phase shift between said first and second terminals of said inductor at a selected frequency corresponding to a predetermined overtone of said piezoelectric crystal, said piezoelectric crystal being connected in a series circuit between said input terminal and the junction of said second capacitor and the second terminal of said inductor; and a balancing circuit including a phase inverting network having first and second junctions and a 180° phase shift and a predetermined amplitude transfer function between said junctions, said first junction being connected to one electrode of said piezoelectric crystal, and a capacitor having a value proportional to the value of said static shunt capacitance and said transfer function connected between said second junction of said phase inverting network and the other electrode of said piezoelectric crystal.

2. An electronic overtone oscillator as recited in claim 1 wherein said inverting network includes a transformer having first and second windings, each having a predetermined number of turns, connected to provide a phase inversion therebetween, said first winding being connected to said first junction and said second winding being connected to said second junction, and wherein said balancing capacitor has a value substantially equal to the static shunt capacitance of said crystal multiplied by the ratio of turns in said first and second windings.

* * * * *